United States Patent
Liu et al.

(10) Patent No.: US 11,309,520 B2
(45) Date of Patent: Apr. 19, 2022

(54) ENCAPSULATION STRUCTURE, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tingliang Liu, Beijing (CN); Yunsheng Xiao, Beijng (CN); Xiangdan Dong, Beijing (CN); Yue Long, Beijing (CN); Kai Zhang, Beijing (CN); Yonglin Guo, Beijing (CN); Hongwei Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 211 days.

(21) Appl. No.: 16/633,892

(22) PCT Filed: Apr. 10, 2019

(86) PCT No.: PCT/CN2019/082105
§ 371 (c)(1),
(2) Date: Jan. 24, 2020

(87) PCT Pub. No.: WO2019/201132
PCT Pub. Date: Oct. 24, 2019

(65) Prior Publication Data
US 2021/0126222 A1  Apr. 29, 2021

(30) Foreign Application Priority Data
Apr. 17, 2018 (CN) .......................... 201810345269.1

(51) Int. Cl.
*H01L 51/52* (2006.01)

(52) U.S. Cl.
CPC ................................ *H01L 51/5253* (2013.01)

(58) Field of Classification Search
CPC .......................... H01L 51/5253; H01L 51/524
See application file for complete search history.

(56) References Cited

U.S. PATENT DOCUMENTS

2014/0319474 A1* 10/2014 Kim ...................... H01L 51/524
257/40
2015/0214504 A1    7/2015 Sonoda et al.
(Continued)

FOREIGN PATENT DOCUMENTS

CN      104521323 A    4/2015
CN      105575910 A    5/2016
(Continued)

OTHER PUBLICATIONS

International Search Report and Written Opinion issued in corresponding International Application No. PCT/CN2019/082105, dated Jun. 27, 2019, with English language translation.
(Continued)

*Primary Examiner* — Kyoung Lee
(74) *Attorney, Agent, or Firm* — McDermott Will & Emery LLP

(57) ABSTRACT

An encapsulation structure includes a first inorganic layer, a first organic layer and a second inorganic layer, all of which are sequentially stacked in a thickness direction of the encapsulation structure. At least one of the first inorganic layer or the second inorganic layer is a crack-resistant layer.

13 Claims, 9 Drawing Sheets

(56) References Cited

U.S. PATENT DOCUMENTS

| | | |
|---|---|---|
| 2015/0303406 A1 | 10/2015 | Kim |
| 2017/0271623 A1 | 9/2017 | Wang et al. |
| 2018/0006271 A1 | 1/2018 | Tang |
| 2018/0081214 A1 | 3/2018 | Yao |
| 2018/0337366 A1 | 11/2018 | Meng et al. |

FOREIGN PATENT DOCUMENTS

| | | |
|---|---|---|
| CN | 105938873 A | 9/2016 |
| CN | 106684256 A | 5/2017 |
| CN | 106847832 A | 6/2017 |
| CN | 108511625 A | 9/2018 |

OTHER PUBLICATIONS

First Office Action issued in corresponding Chinese Application No. 201810345269.1, dated Apr. 26, 2019, with English language translation.

* cited by examiner

ENCAPSULATION STRUCTURE, AND DISPLAY APPARATUS

CROSS-REFERENCE TO RELATED APPLICATIONS

This application is a national phase entry under 35 USC 371 of International Patent Application No. PCT/CN2019/082105 filed on Apr. 10, 2019, which claims priority to Chinese Patent Application No. 201810345269.1, filed with the Chinese Patent Office on Apr. 17, 2018, titled "ENCAPSULATION COVER, AND DISPLAY APPARATUS", which are incorporated herein by reference in their entirety.

TECHNICAL FIELD

The present disclosure relates to the field of display technologies, and in particular, to an encapsulation structure and a display apparatus.

BACKGROUND

Organic light-emitting diode (OLED) displays have a wide range of applications in a display field and a lighting field due to their advantages of thinning, a wide viewing angle, low power consumption, fast response, and flexible display.

SUMMARY

In a first aspect, embodiments of the present disclosure provide an encapsulation structure. The encapsulation structure includes a first inorganic layer, a first organic layer, and a second inorganic layer, all of which are sequentially stacked in a thickness direction of the encapsulation structure. At least one of the first inorganic layer or the second inorganic layer is a crack-resistant layer.

In some embodiments, the crack-resistant layer includes at least one through hole therein, and the at least one through hole pass through the crack-resistant layer in the thickness direction of the encapsulation structure.

In some embodiments, the crack-resistant layer includes a plurality of inorganic pattern units sequentially arranged in a direction from an inside to an outside of the crack-resistant layer. A gap is provided between two adjacent inorganic pattern units, and the gap is a through hole.

In some embodiments, the crack-resistant layer includes a plurality of inorganic pattern units arranged concentrically, a gap is provided between two adjacent inorganic pattern units, and the gap is a through hole.

In some embodiments, in any crack-resistant layer, an inorganic pattern unit located at a center of the crack-resistant layer is a rectangular block, and at least one remaining inorganic pattern unit is a rectangular loop block.

In some embodiments, both the first inorganic layer and the second inorganic layer are crack-resistant layers. At least one orthographic projection of at least one gap in the first inorganic layer on a plane where the encapsulation structure is located and at least one orthographic projection of at least one gap in the second inorganic layer on the plane where the encapsulation structure is located are staggered.

In some embodiments, the encapsulation structure further includes at least one encapsulation group disposed on a side of the second inorganic layer away from the first inorganic layer. Each encapsulation group includes a second organic layer and a third inorganic layer that are sequentially stacked in a direction from the first inorganic layer to the second inorganic layer, and the third inorganic layer is the crack-resistant layer.

In some embodiments, a width of the gap is in a range of 50 µm to 200 µm.

In some embodiments, the encapsulation structure further includes a first region, and a second region surrounding the first region. In the plurality of inorganic pattern units of any crack-resistant layer, a contour of an orthographic projection of an inorganic pattern unit located at a center of the crack-resistant layer on a plane where the inorganic pattern unit is located surrounds a contour of an orthographic projection of the first region on the plane where the inorganic pattern unit is located.

In some embodiments, the second inorganic layer is the crack-resistant layer. A surface of the first organic layer adjacent to the first inorganic layer covers a surface of the first inorganic layer adjacent to the first organic layer and side faces connected to the surface of the first inorganic layer adjacent to the first organic layer.

In some embodiments, the second inorganic layer is the crack-resistant layer. A surface of the second inorganic layer adjacent to the first organic layer covers a surface of the first organic layer adjacent to the second inorganic layer and at least covers side faces of the first organic layer connected to the surface of the first organic layer adjacent to the second inorganic layer.

In some embodiments, at least one orthographic projection of at least one gap in the crack-resistant layer on a plane where the first inorganic layer is located is within a range of the first inorganic layer.

In some embodiments, the encapsulation structure further includes a first region, and a second region locating at a periphery of the first region. A distance from an edge of an orthographic projection of the first inorganic layer on a plane where the first inorganic layer is located to an edge of an orthographic projection of the first region on the plane where the first inorganic layer is located is in a range of 100 µm to 200 µm; or, a distance from an edge of an orthographic projection of the second inorganic layer on a plane where the second inorganic layer is located to an edge of an orthographic projection of the first region on the plane where the second inorganic layer is located is in a range of 400 µm to 600 µm; or, a distance from an edge of an orthographic projection of the first inorganic layer on a plane where the first inorganic layer is located to an edge of an orthographic projection of the first region on the plane where the first inorganic layer is located is in a range of 100 µm to 200 µm and a distance from an edge of an orthographic projection of the second inorganic layer on a plane where the second inorganic layer is located to an edge of an orthographic projection of the first region on the plane where the second inorganic layer is located is in a range of 400 µm to 600 µm.

In some embodiments, a thickness of the first organic layer is greater than a thickness of any of the first inorganic layer and the second inorganic layer.

In another aspect, the embodiments of the present disclosure further provide a display apparatus. The display apparatus includes a substrate provided with at least one organic light-emitting diode (OLED) device, and an encapsulation structure for encapsulating at least one OLED device. The encapsulation structure is the encapsulation structure provided in the above embodiments.

In some embodiments, the substrate further includes a display area and a non-display area located at a periphery of the display area. The encapsulation structure includes a first region, and a second region surrounding the first region. A contour of an orthographic projection of the first region on a plane where the encapsulation structure is located surrounds a contour of an orthographic projection of the display area on the plane where the encapsulation structure is located. In the plurality of inorganic pattern units of any crack-resistant layer, a contour of an orthographic projection of an inorganic pattern unit located at a center of the crack-resistant layer on a plane where the inorganic pattern unit is located surrounds a contour of an orthographic projection of the first region on the plane where the inorganic pattern unit is located.

BRIEF DESCRIPTION OF THE DRAWINGS

In order to describe technical solutions in embodiments of the present disclosure or the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art shall be included in the protection scope of the present disclosure.

Core components of an organic light emitting diode (OLED) display are OLED devices. As new display devices, the OLED devices have advantages of wide color gamut and high contrast. The OLED device includes an anode, a light-emitting layer and a cathode that are sequentially stacked. A light-emitting principle of the OLED device is that: under driving of an applied voltage, positively charged holes excited from the anode and negatively charged electrons excited from the cathode are recombined in the light-emitting layer to release energy, so that molecules of luminescent materials in the light-emitting layer are excited by the energy, and then emit light.

The OLED device further includes: a hole injection layer and a hole-transporting layer that are located between the anode and the light-emitting layer, and are sequentially stacked in a direction from the anode to the light-emitting layer; and an electron-transporting layer that is located between the cathode and the light-emitting layer. The hole injection layer, the hole-transporting layer and the electron-transporting layer are generally made of functional materials so as to improve transmission efficiency during the injecting of holes and electrons to the light-emitting layer respectively from the anode and the cathode, thereby improving light-emitting efficiency of the OLED device.

However, the luminescent materials, functional materials and electrode materials in the OLED device are very sensitive to pollutants, water vapor, and oxygen in the atmosphere, and are prone to electrochemical corrosion in an environment containing water vapor and oxygen. As a result, the OLED device may be damaged. Therefore, the OLED device should be effectively encapsulated to isolate the OLED device from water vapor, oxygen, etc. in the atmosphere to prevent water vapor and oxygen from entering an interior of the OLED device.

Figure 1:
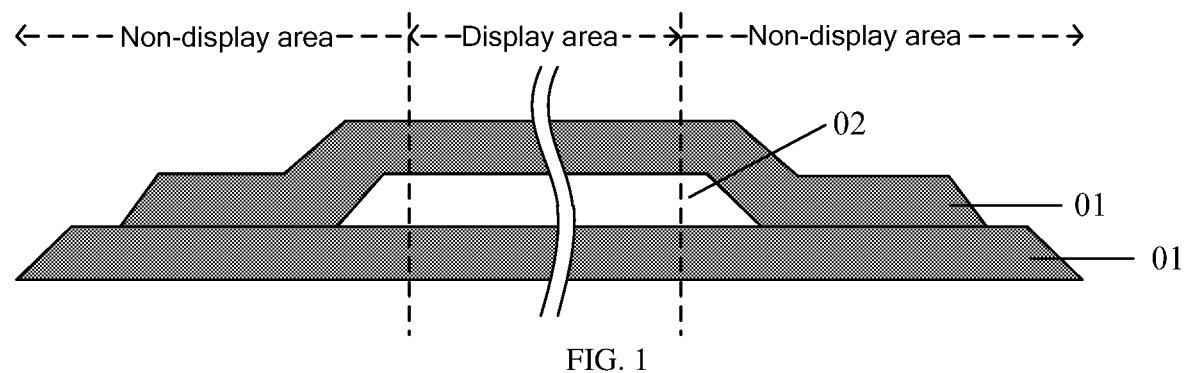
FIG. 1 is a schematic structural diagram of a cross-section of an encapsulation structure in a thickness direction thereof, in the related art.

In the related art, an encapsulation layer is provided for encapsulating a plurality of OLED devices in a display panel. As shown in FIG. 1, the encapsulation layer has a stacked structure in which an inorganic film 01, an organic film 02, and an inorganic film 01 are sequentially arranged.

However, one layer or two layers of inorganic films 01 in the above structure are uniform layer structures. After the OLED devices are encapsulated by the encapsulation layer, in a case where the inorganic film 01 is cracked during long-term use process, generated cracks may extend in an entire inorganic film 01 since toughness of the inorganic film 01 is lower than that of the organic film 02, which results in failure of encapsulation.

For example, after the crack is generated at an edge of the inorganic film 01 (i.e., in a non-display area), the generated crack may extend from an edge of the display panel to a display area, so that the OLED devices in the display area are electrochemically corroded due to ingress of water vapor and oxygen through the crack. Therefore, a display product is prone to random failure, which greatly affects the reliability and yield of the display product.

Figure 2:
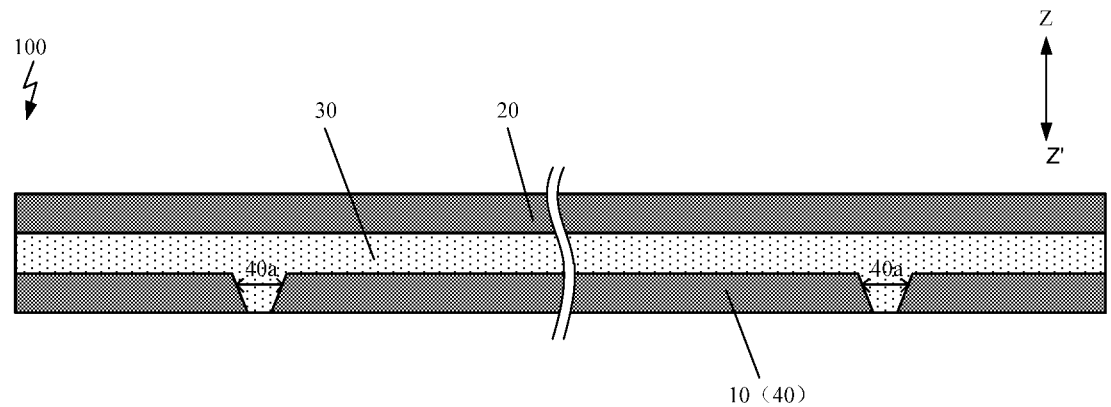
FIG. 2 is a schematic structural diagram of a cross-section of an encapsulation structure in a thickness direction thereof, provided by some embodiments of the present disclosure.
Figure 3:
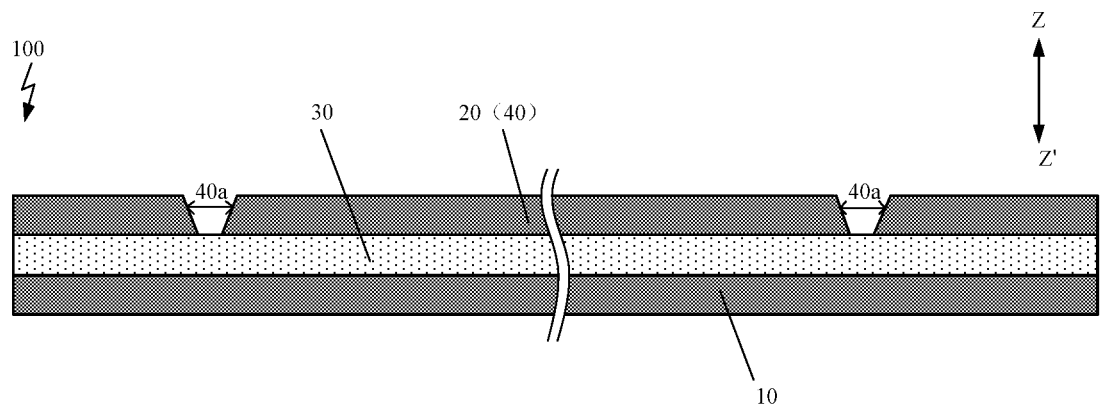
FIG. 3 is a schematic structural diagram of a cross-section of another encapsulation structure in a thickness direction thereof, provided by some embodiments of the present disclosure.
Figure 4:
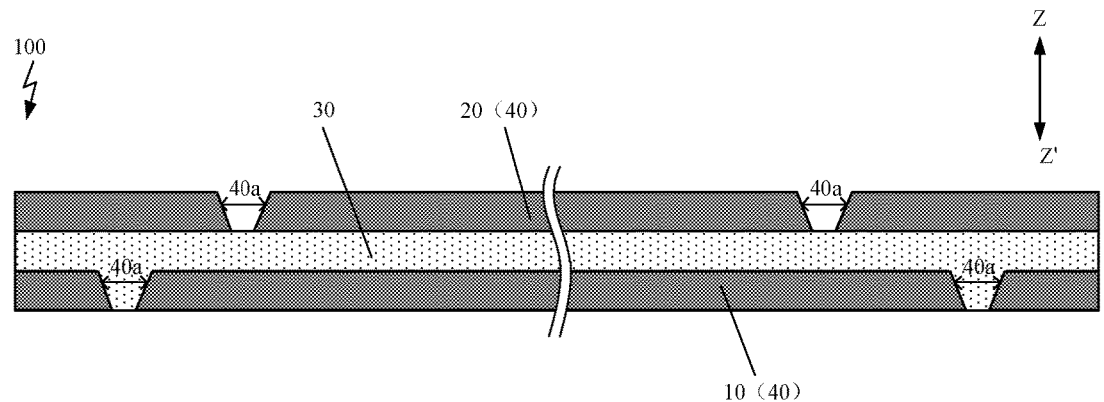
FIG. 4 is a schematic structural diagram of a cross-section of yet another encapsulation structure in a thickness direction thereof, provided by some embodiments of the present disclosure.

Some embodiments of the present disclosure provide an encapsulation structure 100. As shown in FIGS. 2-4, the encapsulation structure includes a first inorganic layer 10, a first organic layer 30, and a second inorganic layer 20 that are sequentially stacked in a thickness direction Z'-Z of the encapsulation structure 100. At least one of the first inorganic layer 10 and the second inorganic layer 20 is a crack-resistant layer 40.

It will be understood that the above description "at least one of the first inorganic layer 10 and the second inorganic layer 20 is a crack-resistant layer 40" means that a structure of the at least one of the first inorganic layer 10 and the second inorganic layer 20 is the same as a structure of the crack-resistant layer 40.

That is, as shown in FIG. 2, the first inorganic layer 10 is the crack-resistant layer 40; or as shown in FIG. 3, the second inorganic layer 20 is the crack-resistant layer 40; or as shown in FIG. 4, the first inorganic layer 10 is one crack-resistant layer 40, and the second inorganic layer 20 is another crack-resistant layer 40.

That is, the at least one of the first inorganic layer 10 and the second inorganic layer 20 is an inorganic layer that is capable of preventing cracks from extending.

In the encapsulation structure 100 provided by some embodiments of the present disclosure, on the one hand, the first organic layer 30 located between two inorganic layers is mainly made of organic materials. Due to a long molecular chain of the organic material, gaps inside the organic material are large, which can provide a certain buffering effect for the cracks, thereby providing an effectively resistant effect on the cracks. On the other hand, the first inorganic layer 10 and the second inorganic layer 20 that are located at different sides of the first organic layer 30 are mainly made of inorganic materials. Compactness of the inorganic material is higher than compactness of the organic material, and thus the inorganic materials have a better resistant effect on water vapor and oxygen. In addition, the at least one of the first inorganic layer 10 and the second inorganic layer 20 is the crack-resistant layer, thereby preventing the cracks from extending.

Therefore, after devices (for example, OLED devices) to be encapsulated are encapsulated by the encapsulation structure 100 provided by some embodiments of the present disclosure, during use of the display apparatus including the encapsulation structure 100 and the OLED devices, it is possible to avoid or alleviate a problem that the water vapor and oxygen enter the interior of the display apparatus through cracks in the encapsulation structure 100, which cause electrochemical corrosion of the OLED devices.

Figure 5:
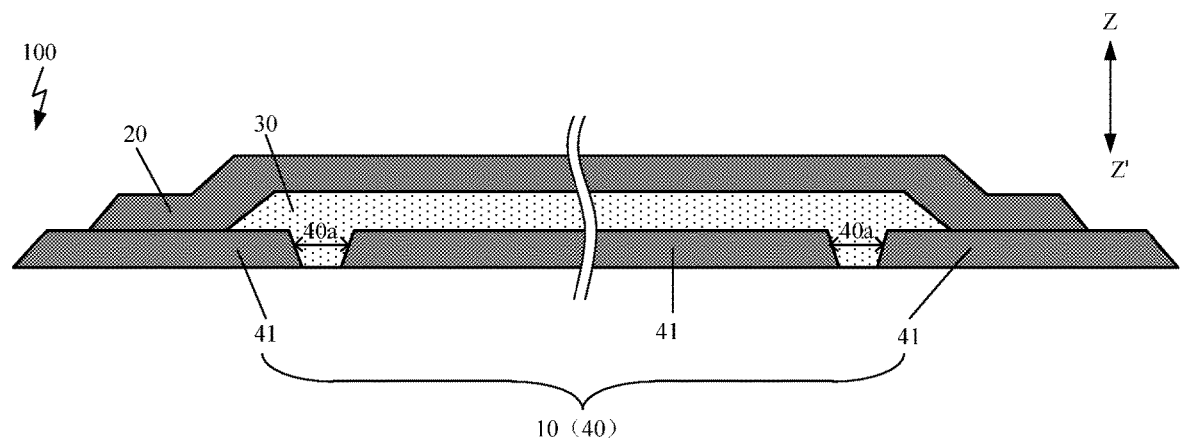
FIG. 5 is a schematic structural diagram of a cross-section of yet another encapsulation structure in a thickness direction thereof, provided by some embodiments of the present disclosure.
Figure 6:
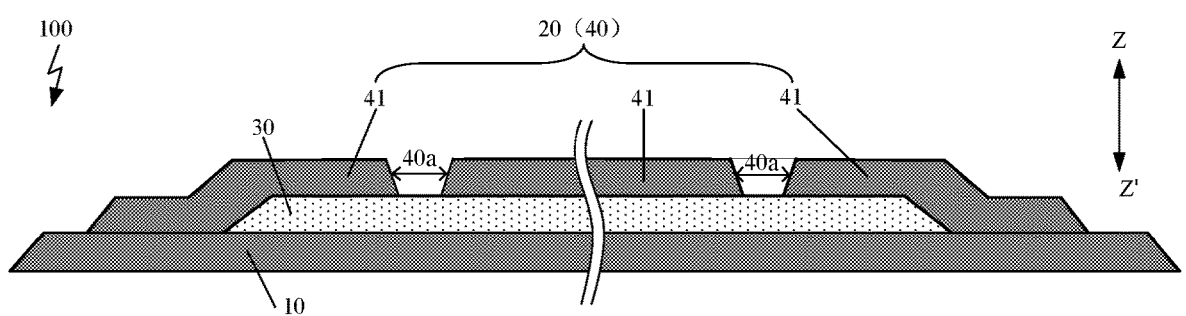
FIG. 6 is a schematic structural diagram of a cross-section of yet another encapsulation structure in a thickness direction thereof, provided by some embodiments of the present disclosure.
Figure 7:
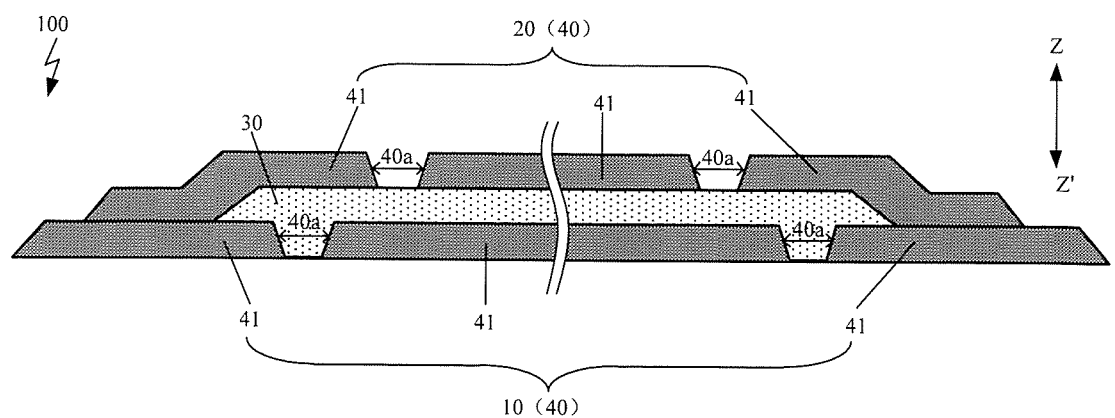
FIG. 7 is a schematic structural diagram of a cross-section of yet another encapsulation structure in a thickness direction thereof, provided by some embodiments of the present disclosure.

In some embodiments of the present disclosure, as shown in FIGS. 5-7, the crack-resistant layer 40 includes at least one through hole 40a therein.

Here, a through hole 40a refers to a part formed in the crack-resistant layer 40 and passing through the crack-resistant layer 40, and the part is not provided to connect an edge of the crack-resistant layer 40.

It will be understood that, as shown in FIGS. 5-7, since the first inorganic layer 10, the first organic layer 30, and the second inorganic layer 20 are sequentially stacked in the thickness direction Z'-Z of the encapsulation structure 100, two adjacent layers of the three layers (i.e., the first inorganic layer 10, the first organic layer 30, and the second inorganic layer 20) are in close contact with each other. In addition, since the organic material generally has certain fluidity, as shown in FIGS. 5 and 7, in a case where the first inorganic layer 10 is the crack-resistant layer 40, during a process of manufacturing the first organic layer 30 on the first inorganic layer 10, a portion of the organic material enters the through hole 40a to fill the through hole 40a, which is advantageous for improving flatness of the entire encapsulation structure 100.

In the FIGS. 5-7, a shape of the cross-section of the through hole 40a is only illustrated as a trapezoid. In a direction from the first inorganic layer 10 to the second inorganic layer 20, a length of an upper side of the trapezoid is greater than a length of a lower side of the trapezoid, but some embodiments of the present disclosure are not limited thereto. The shape of the cross-section of the through hole 40a may be a rectangular, or a trapezoid of which the length of the upper side is less than the length of the lower side, as long as the through hole 40a can pass through the crack-resistant layer 40.

After a crack is generated in the crack-resistant layer 40, since the crack-resistant layer 40 includes at least one through hole 40a therein, the crack will stop extending when it extends to any through hole 40a, thereby preventing the crack from extending to the entire crack-resistant layer 40. The crack is prevented from further extending, thereby improving a product yield of the display apparatus including the encapsulation structure 100 and the OLEO devices.

The number, shape, and distribution manner of the through hole(s) 40a in the crack-resistant layer 40 are not limited, and may be flexibly set according to specific application requirements.

For example, a large number of through holes 40a may be arranged in the crack-resistant layer 40, or the through holes 40a may be widely distributed in the crack-resistant layer 40, or a large number of through holes 40a may be arranged in the crack-resistant layer 40 and the through holes 40a may be widely distributed in the crack-resistant layer 40. In this way, the display apparatus may meet usage requirements in a case where the display apparatus is used in a usage where a large number of cracks may occur, or cracks may extend in various directions, or a large number of cracks may occur and the cracks may extend in various directions. Thereby, further extension of the cracks in the entire crack-resistant layer 40 is resisted.

Or, a small number of through hole(s) 40a may be arranged in the crack-resistant layer 40, or the through hole(s) 40a may be concentratedly distributed in the crack-resistant layer 40, or a small number of through hole(s) 40a may be arranged in the crack-resistant layer 40 and the through hole(s) 40a may be concentratedly distributed in the crack-resistant layer 40. In this way, the display apparatus may meet usage requirements in a case where the display apparatus is used in a usage where a small number of crack(s) may occur, or crack(s) may extend in a single direction, or a small number of crack(s) may occur and the crack(s) may extend in a single direction. Thereby, further extension of the crack(s) in the entire crack-resistant layer 40 is resisted.

Of course, in some other embodiments of the present disclosure, the crack-resistant layer 40 may be obtained by modifying a specific structure of an inorganic layer, so that at least one of the first inorganic layer 10 and the second inorganic layer 20 has a function of preventing the crack(s) from extending.

For example, the crack-resistant layer 40 may be formed by alternately arranging a compact portion and a loose portion. In a case where a crack is generated in the crack-resistant layer 40, since different regions of the crack-resistant layer 40 have different compactness, the crack-resistant layer 40 is non-uniform in its structure, so that it is difficult for the crack to continuously extend through different portions of the crack-resistant layer 40. Thereby, further extension of the crack in the entire crack-resistant layer 40 is resisted.

In an example where the through hole(s) 40a are arranged in the crack-resistant layer 40, the structure of the crack-resistant layer 40 will be described in detail below.

Figure 8:
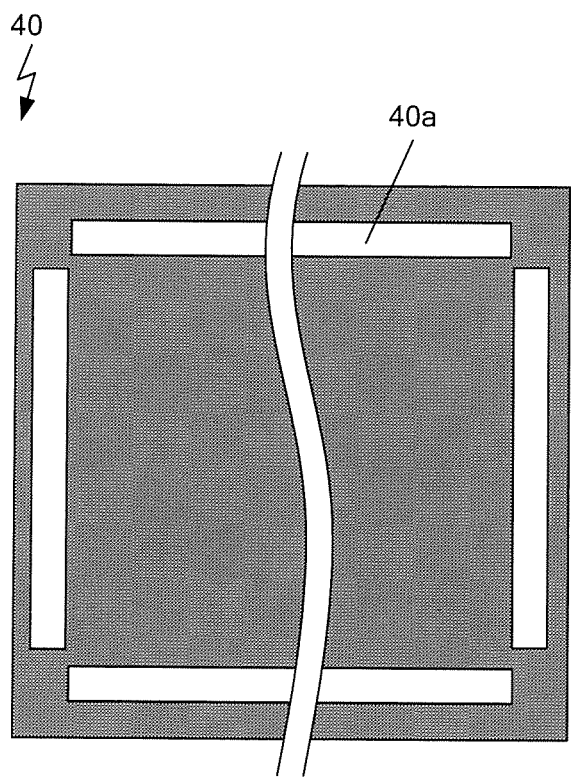
FIG. 8 is a schematic top view showing a structure of a crack-resistant layer in an encapsulation structure provided by some embodiments of the present disclosure.

In some embodiments of the present disclosure, as shown in FIG. 8, the crack-resistant layer 40 includes at least one through hole 40a therein, and a shape of each through hole 40a may be, for example, a strip.

FIG. 8 only shows an example in which the number of the through holes 40a is four, and the four through holes 40a are symmetrically disposed. The specific number and arrangement manner of the through holes are not limited thereto.

Figure 9:
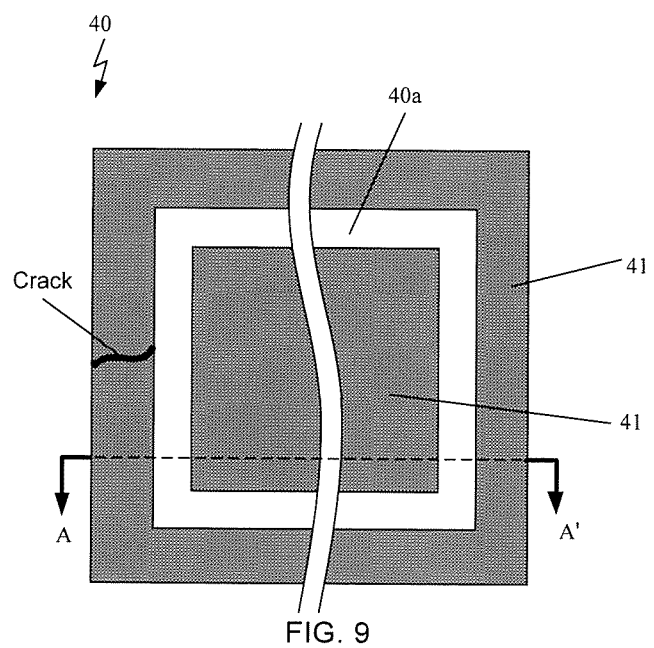
FIG. 9 is a schematic top view showing a structure of another crack-resistant layer in an encapsulation structure provided by some embodiments of the present disclosure.
Figure 10:
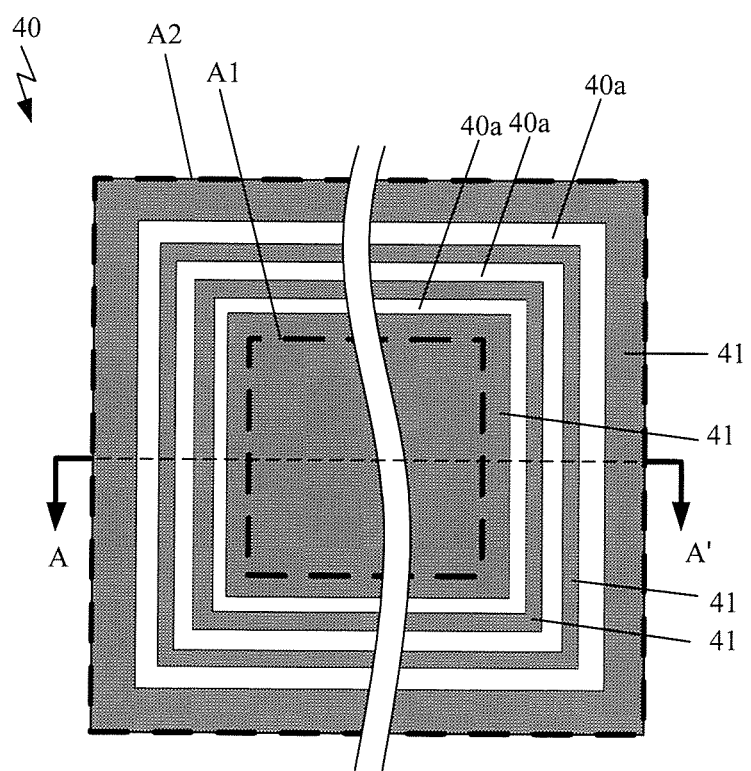
FIG. 10 is a schematic top view showing a structure of yet another crack-resistant layer in an encapsulation structure provided by some embodiments of the present disclosure.

In some other embodiments of the present disclosure, in order to further improve the effect of preventing the cracks from extending, as shown in FIGS. 9 and 10, any crack-resistant layer 40 includes a plurality of inorganic pattern units 41 sequentially arranged in a direction from an inside to an outside of the crack-resistant layer 40. There is a gap between two adjacent inorganic pattern units 41, and the gap is the through hole 40a. That is, a gap is a through hole 40a.

Here, a direction for the cross-sections of FIGS. 5-7 corresponds to an A-A' direction in FIG. 9.

It will be understood that, among the plurality of inorganic pattern units 41 of any crack-resistant layer 40 that are sequentially arranged in a direction from the inside to the outside of the crack-resistant layer 40, inorganic pattern unit(s) 41 (such as one of the inorganic pattern units 41 illustrated in FIG. 9 or three of the inorganic pattern units 41 illustrated in FIG. 10) located outside the center each are a loop, and each loop includes but is not limited to the rectangular loop illustrated in FIGS. 9-10, a circular loop, an elliptical loop, or a diamond loop, etc.

For example, in any crack-resistant layer 40, an inorganic pattern unit 41 located at the center is a rectangular block, and remaining inorganic pattern unit(s) 41 are rectangular loop block(s) and sequentially surround the rectangular block at the center in a direction from the inside to the outside of the crack-resistant layer 40.

As will be seen from the foregoing description, that the structure of the at least one of the first inorganic layer 10 and the second inorganic layer 20 is the same as the structure of the crack-resistant layer 40, means following cases.

Figure 11:
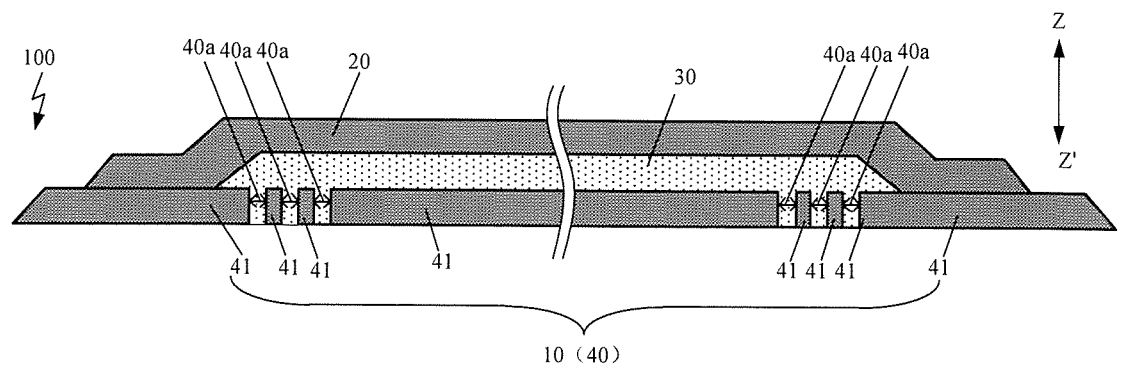
FIG. 11 is a schematic structural diagram of a cross-section of yet another encapsulation structure in a thickness direction thereof, provided by some embodiments of the present disclosure.

As shown in FIGS. 5 and 11, the first inorganic layer 10 includes a plurality of inorganic pattern units 41 sequentially arranged in a direction from an inside to an outside of the first inorganic layer 10, and there is a gap between two adjacent inorganic pattern units 41.

Figure 12:
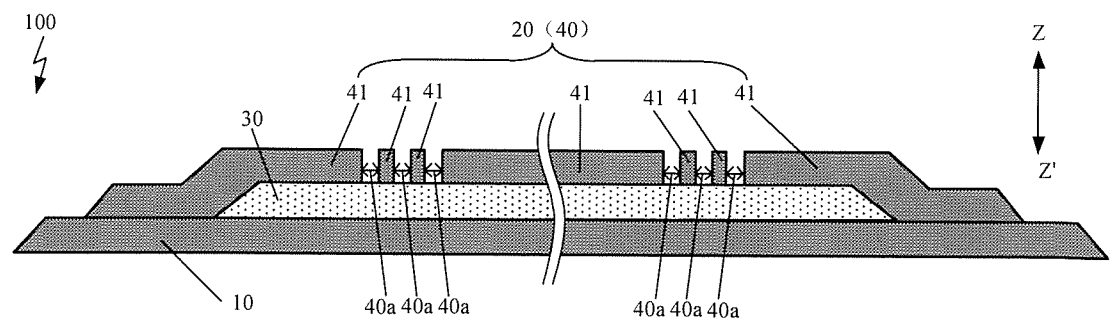
FIG. 12 is a schematic structural diagram of a cross-section of yet another encapsulation structure in a thickness direction thereof, provided by some embodiments of the present disclosure.

Or as shown in FIGS. 6 and 12, the second inorganic layer 20 includes a plurality of inorganic pattern units 41 sequentially arranged in a direction from an inside to an outside of the second inorganic layer 20, and there is a gap between two adjacent inorganic pattern units 41.

Figure 13:
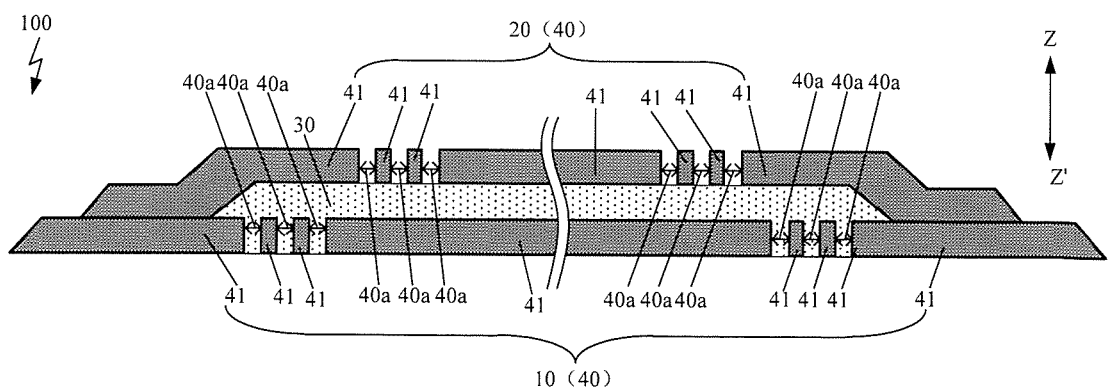
FIG. 13 is a schematic structural diagram of a cross-section of yet another encapsulation structure in a thickness direction thereof, provided by some embodiments of the present disclosure.

Or as shown in FIGS. 7 and 13, the first inorganic layer 10 includes a plurality of inorganic pattern units 41 sequentially arranged in a direction from the inside to the outside of the first inorganic layer 10, and there is a gap between two adjacent inorganic pattern units 41; and the second inorganic layer 20 also includes a plurality of inorganic pattern units 41 sequentially arranged in a direction from the inside to the outside of the second inorganic layer 20, and there is a gap between two adjacent inorganic pattern units 41.

Here, a direction for cross-sections of FIGS. 11-13 corresponds to the A-A' direction in FIG. 10.

As shown in FIG. 5 and FIG. 7, since the organic material generally has certain fluidity, in a case where the first inorganic layer 10 is the crack-resistant layer 40, during the process of manufacturing the first organic layer 30 on the first inorganic layer 10, a portion of the organic material enters the gap between two adjacent inorganic pattern units 41 to fill the gap, which is advantageous for improving flatness of the entire encapsulation structure 100.

A width of the gap between two adjacent inorganic pattern units 41 is not limited. The arrangement manner of two adjacent inorganic pattern units 41 is that one inorganic pattern unit 41 surrounds the other inorganic pattern unit 41. The width of the gap between two adjacent inorganic pattern units 41 may be equal everywhere, that is, the width of the gap is a constant value; or the width of the gap between two adjacent inorganic pattern units 41 may be set to different values in different regions; or the width of the gap between two adjacent inorganic pattern units 41 may be set to not completely identical values in different regions.

For example, the width of the gap between two adjacent inorganic pattern units 41 may be, for example, in a range of 50 μm to 200 μm. The width of the gap in the range may effectively resist the extension of the crack and maintain a certain structural strength of the entire crack-resistant layer 40, which is advantageous for further improving the encapsulation effect.

The width of the gap between two adjacent inorganic pattern units 41 may be any one of 70 μm, 90 μm, 100 μm, 120 μm, 140 μm, 150 μm, 160 μm, and 180 μm.

Due to high compactness of the inorganic material in the related art, the inorganic material has a good resistant effect on water vapor and oxygen. However, the cracks tend to extend in the inorganic material. In contrast, the organic material has a long molecular chain and gaps inside the organic material are large. Therefore, the organic material has a good buffering effect on the cracks. However, due to large gaps inside the organic material, the organic material has a poor resistant effect on water vapor and oxygen.

In some embodiments of the present disclosure, the crack-resistant layer 40 illustrated in FIG. 9 is taken as an example. After a crack (illustrated by a thick solid line in FIG. 9) is generated in the crack-resistant layer 40, due to a gap between two adjacent inorganic pattern units 41, the crack stops extending at the position of the gap.

That is, after a crack is generated in an inorganic pattern unit 41, the crack cannot continuously extend through the gap to adjacent inorganic pattern unit(s) 41, thereby effectively preventing the extension of the crack in the crack-resistant layer 40, and avoiding the extension of the crack in the entire encapsulation structure 100.

Therefore, in the encapsulation structure 100 provided by some embodiments of the present disclosure, the encapsulation structure 100 includes at least one crack-resistant layer 40 including a plurality of inorganic pattern units 41 sequentially arranged in a direction from the inside to the outside of the crack-resistant layer 40. There is a gap between two adjacent inorganic pattern units 41 so that the crack cannot extend in the crack-resistant layer 40, and the extension of the crack is effectively prevented.

In the related art, the crack in the encapsulation layer generally generates at a place proximate to the edge, and the crack will extend from the edge to the center. However, in the encapsulation structure 100 provided by some embodiments of the present disclosure, the crack may be resistant from extending from the edge to the center of the encapsulation structure 100 because of the arrangement manner of the crack-resistant layer 40 which includes the plurality of inorganic pattern units 41 sequentially arranged in a direction from the inside to the outside of the crack-resistant layer 40.

In this way, when the encapsulation structure 100 is applied to a display apparatus, the crack may be prevented from extending to a display area. Therefore, a problem of electrochemical corrosion of the OLED devices in the display area due to the ingress of water vapor and oxygen may be avoided.

Since a uniform inorganic layer with a layer structure in an encapsulation layer in the related art is prone to generating cracks, in some embodiments of the present disclosure, the structure of at least one of the first inorganic layer 10 and the second inorganic layer 20 in the encapsulation structure 100 is arranged as the structure of the crack-resistant layer 40, so that the at least one of the first inorganic layer 10 and the second inorganic layer 20 may have the effect of preventing the extension of the cracks. Compared with the encapsulation layer in the related art, the probability of the extension of the cracks may be reduced. Therefore, the encapsulation effect of the encapsulation structure 100 may be improved.

In addition, since the gap in the crack-resistant layer 40 may prevent the extension and accumulation of tensile force, in the encapsulation structure 100 provided by some embodiments of the present disclosure, a risk of breakage of an edge of the encapsulation structure 100 may be reduced by using the design manner in which the crack-resistant layer 40 has gap(s). In this way, encapsulation reliability of the encapsulation structure 100 may be improved in a case where it is applied to a flexible display apparatus. Moreover, the gap(s) in the crack-resistant layer 40 are filled with an organic material or correspond to the first organic layer 30. Since the organic material has a poor resistant effect on water vapor and oxygen, in a process of testing the encapsulation performance of a product, by determining position(s) of the gap(s) in the crack-resistant layer 40 before testing, a position and/or degree of intrusion of water vapor may be determined simply and effectively according to the position(s) of the gap(s), which may greatly improve reliability of a production process.

For example, the plurality of inorganic pattern units 41 in any crack-resistant layer 40 may be formed synchronously by a same process to simplify the manufacturing process of the crack-resistant layer 40.

For example, the above crack-resistant layer 40 may be formed by an evaporation process or a chemical vapor deposition (CVD) process.

It will be understood that since at least one of the first inorganic layer 10 and the second inorganic layer 20 is the crack-resistant layer 40, a material for forming the crack-resistant layer 40 by the evaporation process or the chemical vapor deposition process is an inorganic material. Since any crack-resistant layer 40 includes a plurality of inorganic pattern units 41 sequentially arranged in a direction from the inside to the outside of the crack-resistant layer 40, and there is a gap between two adjacent inorganic pattern units 41, the two adjacent inorganic pattern units 41 are not in contact with each other (i.e., independent of each other).

Therefore, in the process of forming the crack-resistant layer 40 by the evaporation process or the chemical vapor deposition process, a fine metal mask (FMM) may be used, so that during the evaporation process or the chemical vapor deposition process, the generated gaseous inorganic material is deposited on a base through opening portions of the FMM to respectively form the inorganic pattern units 41 which are spaced apart from each other in the above crack-resistant layer 40.

In some embodiments of the present disclosure, thicknesses and materials of the first inorganic layer 10, the second inorganic layer 20, and the first organic layer 30 are not limited.

For example, the thickness of the first organic layer 30 is greater than the thickness of any of the first inorganic layer 10 and the second inorganic layer 20.

The material of the first organic layer 30 may be one or more of polyvinyl alcohol, a polyurethane acrylate polymer, and a polyimide resin.

For example, the thickness and material of the first inorganic layer 10 may be identical to or different from the thickness and material of the second inorganic layer 20 respectively.

The thickness of the first inorganic layer 10 and the thickness of the second inorganic layer 30 may be, for example, in a range of 0.1 µm to 1.5 µm. For example, the thickness may be 0.5 µm or 1.0 µm.

The thickness of the first organic layer 30 may be, for example, in a range of 5 µm to 12 µm. For example, the thickness may be 8 µm or 10 µm.

The material of any of the first inorganic layer 10 and the second inorganic layer 20 may be, for example, one or more of aluminum oxide, zinc oxide, titanium oxide, silicon dioxide, silicon nitride, and zirconium oxide.

In some embodiments of the present disclosure, the crack-resistant layer 40 illustrated in FIGS. 9 and 10 may include a plurality of inorganic pattern units 41 arranged concentrically. There is a gap between two adjacent inorganic pattern units 41, and the gap is the through hole 40*a*.

Here, "arranged concentrically" means that the centers of the plurality of inorganic pattern units 41 coincide, and the plurality of inorganic pattern units 41 are sequentially arranged in a direction from the inside to the outside of the crack-resistant layer 40.

As will be seen from the foregoing description, that the structure of the at least one of the first inorganic layer 10 and the second inorganic layer 20 is the same as the structure of the crack-resistant layer 40, means following cases.

As shown in FIGS. 5 and 11, the first inorganic layer 10 includes a plurality of inorganic pattern units 41 arranged concentrically, and there is a gap between two adjacent inorganic pattern units 41.

Or as shown in FIGS. 6 and 12, the second inorganic layer 20 includes a plurality of inorganic pattern units 41 arranged concentrically, and there is a gap between two adjacent inorganic pattern units 41.

Or as shown in FIGS. 7 and 13, the first inorganic layer 10 includes a plurality of inorganic pattern units 41 arranged concentrically, and there is a gap between two adjacent inorganic pattern units 41; and the second inorganic layer 20 also includes a plurality of inorganic pattern units 41 arranged concentrically, and there is a gap between two adjacent inorganic pattern units 41.

For example, in any crack-resistant layer 40, sizes of the plurality of inorganic pattern units 41 arranged concentrically may be identical, completely different, or not completely identical, which may be determined according to specific structural requirements of the encapsulation structure.

As shown in FIGS. 9 and 10, the plurality of inorganic pattern units 41 may be a rectangular block and rectangular loops that sequentially surround the rectangular block in a direction from the inside to the outside of the crack-resistant layer 40, all of which are arranged concentrically. Or, the plurality of inorganic pattern units 41 may also be a circular block and circular loops that sequentially surround the circular block in a direction from the inside to the outside of the crack-resistant layer 40, all of which are arranged concentrically. The plurality of inorganic pattern units 41 may have other shapes, which may be determined according to the shape of a structure to be encapsulated by the encapsulation structure 100.

Figure 14:
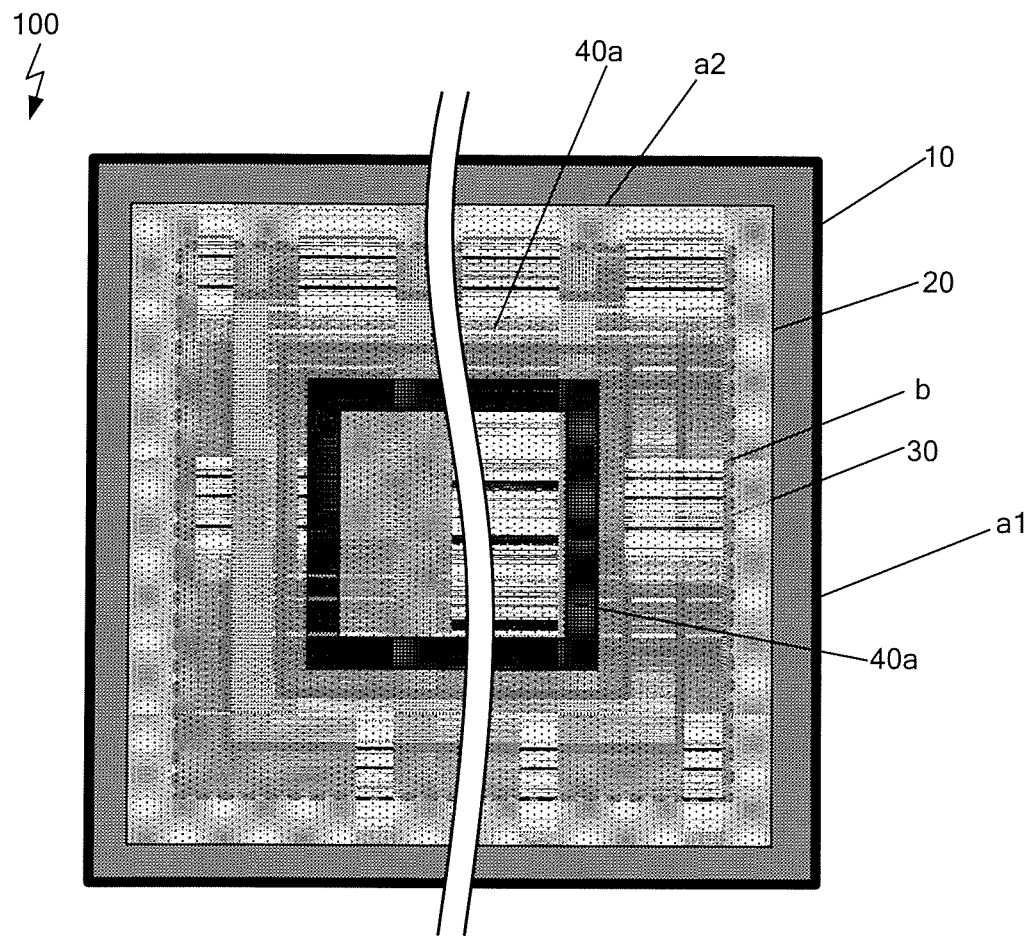
FIG. 14 is a schematic top view showing a structure of an encapsulation structure provided by some embodiments of the present disclosure.

In some embodiments of the present disclosure, as shown in FIGS. 7, 13, and 14, both the first inorganic layer 10 and the second inorganic layer 20 are crack-resistant layers 40. Orthographic projection(s) of gap(s) in the first inorganic layer 10 (40) on a plane where the encapsulation structure 100 is located and orthographic projection(s) of gap(s) in the second inorganic layer 20 (40) on the plane where the encapsulation structure 100 is located are staggered.

As will be seen from FIGS. 7 and 13, the gap between two adjacent inorganic pattern units 41 in the first inorganic layer 10 (40) and the gap between two adjacent inorganic pattern units 41 in the second inorganic layer 20 (40) do not overlap.

That is, as will be seen from FIG. 14, a contour of the gap between two adjacent inorganic pattern units 41 in the first inorganic layer 10 (40) and a contour of the gap between two adjacent inorganic pattern units 41 in the second inorganic layer 20 (40) do not overlap.

Here, in FIG. 14, a thick solid line a1 represents a contour of the first inorganic layer 10, a thin solid line a2 represents a contour of the second inorganic layer 20, and a dotted line b represents a contour of the first organic layer 30. Gap(s) in the first inorganic layer 10 is filled by the first organic layer 30.

Here, for example, the first organic layer 30 may be formed by an ink-jet printing technique. Since the organic material has fluidity, the organic material may fill into the gap(s) in the first inorganic layer 10 during the ink-jet printing process, so that the formed first organic layer 30 has a relatively flat surface.

In a case where the OLED devices are encapsulated by the above encapsulation structure 100, a distance between the first inorganic layer 10 in the encapsulation structure 100 and the OLED devices is less than a distance between the second inorganic layer 20 and the OLED devices, that is, the second inorganic layer 20 is relatively proximate to the external environment. In this way, after water vapor and oxygen enter through the gap(s) in the second inorganic layer 20, they will not directly enter the gap(s) in the first inorganic layer 10 and thus will not enter the interior of the display apparatus, but will disperse in all directions (i.e., 360°). Since the amount of water vapor and oxygen invading through the gap(s) in the second inorganic layer 20 is limited, it is difficult for water vapor and oxygen to further enter the gap(s) in the first inorganic layer 10, thereby improving the encapsulation effect of the encapsulation structure 100.

Figure 15:
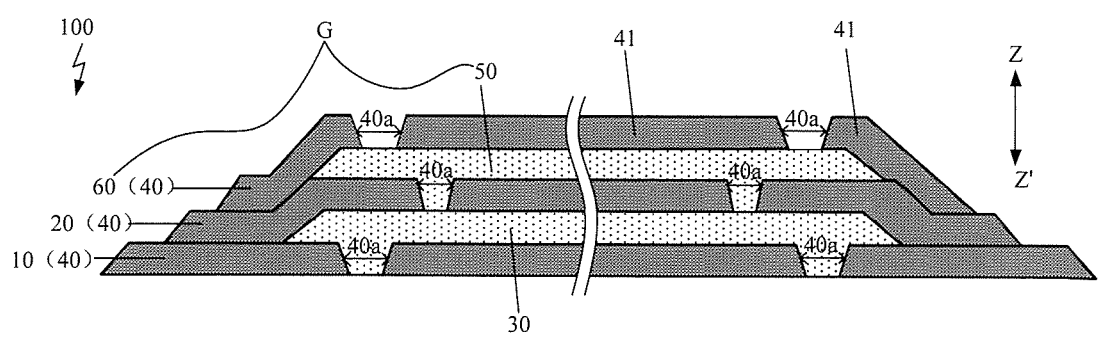
FIG. 15 is a schematic structural diagram of a cross-section of yet another encapsulation structure in a thickness direction thereof, provided by some embodiments of the present disclosure.

In some embodiments of the present disclosure, as shown in FIG. 15, the encapsulation structure 100 further includes at least one encapsulation group G disposed above the second inorganic layer 20. The encapsulation group G includes a second organic layer 50 and a third inorganic layer 60 which are sequentially stacked in the thickness direction Z'-Z of the encapsulation structure 100. The third inorganic layer 60 is a crack-resistant layer 40.

Here, the direction for the cross-section of FIG. 15 corresponds to the A-A' direction in FIG. 9.

It will be understood that a specific structure of the third inorganic layer 60 may refer to the above related description in a case where the third inorganic layer 60 is a crack-resistant layer 40. Hereinafter, a description will be made by only taking an example in which the third inorganic layer 60 includes the plurality of inorganic pattern units 41 sequentially arranged in a direction from an inside to an outside of the third inorganic layer 60, and there is a gap (i.e., the through hole 40a) between two adjacent inorganic pattern units 41.

FIG. 14 only illustrates that both the first inorganic layer 10 and the second inorganic layer 20 are crack-resistant layers 40. Some embodiments of the present disclosure are not limited thereto, and it is also possible that the first inorganic layer 10 or the second inorganic layer 20 is a crack-resistant layer 40. The specific structure of the crack-resistant layer 40 may refer to the above description, and details will not be described here again.

Moreover, FIG. 15 only illustrates a case where the encapsulation structure 100 further includes one encapsulation group G (i.e., the second organic layer 50 and the third inorganic layer 60 that is located thereon form a group) disposed on the second inorganic layer 20. In a case where the encapsulation structure 100 includes a plurality of encapsulation groups G, the plurality of encapsulation groups G are sequentially stacked in the thickness direction Z'-Z of the encapsulation structure 100. That is, organic layer(s) and inorganic layer(s) are sequentially formed on the third inorganic layer 60. Each time an organic layer is formed, an inorganic layer will be formed correspondingly.

In this way, the encapsulation effect of the entire encapsulation structure 100 may be further improved by providing at least one encapsulation group G above the second inorganic layer 20.

For example, as shown in FIG. 15, in a case where the second inorganic layer 20 is a crack-resistant layer 40 (that is, the second inorganic layer 20 includes a plurality of inorganic pattern units sequentially arranged in a direction from the inside to the outside of the second inorganic layer 20, and there is a gap (i.e., the through hole 40a) between two adjacent inorganic pattern units), a gap between two adjacent inorganic pattern units 41 in the third inorganic layer 60 (40) and a gap between two adjacent inorganic pattern units 41 in the second inorganic layer 20 are staggered, so as to prevent water vapor and oxygen from directly entering the gap(s) in the second inorganic layer 20 through the gap(s) in the third inorganic layer 60 (40), thereby further improving the encapsulation effect.

For example, in a case where the encapsulation structure 100 includes a plurality of encapsulation groups G disposed above the second inorganic layer 20, in two adjacent encapsulation groups G, a gap between two adjacent inorganic pattern units 41 in a third inorganic layer 60 (40) of one encapsulation groups G and a gap between two adjacent inorganic pattern units 41 in a third inorganic layer 60 (40) of the other encapsulation groups G are staggered, so that it is more difficult for water vapor and oxygen to enter the second inorganic layer below through the plurality of encapsulation groups G that are stacked, thereby further improving the encapsulation effect.

All of the above arrangement manners of the structures are to better prevent water vapor and oxygen from passing through the encapsulation structure 100.

Figure 16:
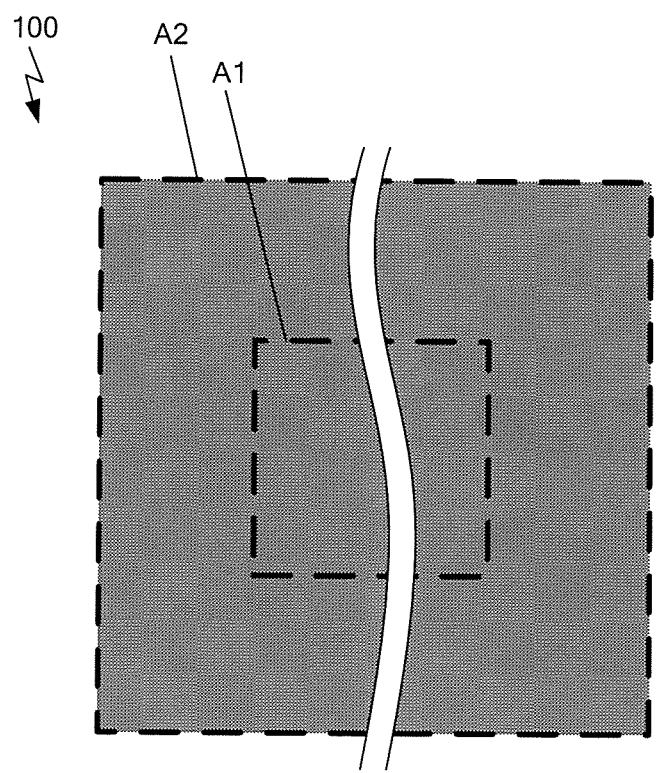
FIG. 16 is a schematic top view showing a structure of another encapsulation structure provided by some embodiments of the present disclosure.

In some embodiments of the present disclosure, as shown in FIGS. 10 and 16, the encapsulation structure 100 includes a first region A1 (i.e., a rectangular region as shown in FIGS. 10 and 16, which is located at the center of the encapsulation structure 100 and surrounded by a thick dotted line) and a second region A2 surrounding the first region A1 (i.e., a rectangular annular region as shown in FIGS. 10 and 16, which is surrounded by thick dotted lines).

As shown in FIG. 10, in the plurality of inorganic pattern units 41 (for example, a plurality of inorganic pattern units 41 arranged concentrically) of the crack-resistant layer 40, a contour of an orthographic projection of an inorganic pattern unit 41 located at the center of the crack-resistant layer 40 on a plane where the inorganic pattern unit is located surrounds a contour of an orthographic projection of the first region A1 on the plane where the inorganic pattern unit is located.

Here, in a case where the second inorganic layer 20 is a crack-resistant layer 40, "a plane where the inorganic pattern unit is located" means a surface of the first organic layer 30 adjacent to the second inorganic layer 20; and in a case where the first inorganic layer 10 is a crack-resistant layer 40, "a plane where the inorganic pattern unit is located" means a surface of a base on which devices to be encapsulated is placed.

That is, in the case where the first inorganic layer 10 is the crack-resistant layer 40, the gap(s) in the first inorganic layer 10 is arranged outside the first region A1, and an inorganic pattern unit 41 located at the center of the first inorganic layer 10 covers the entire first region A1. Similarly, in the case where the second inorganic layer 20 is the crack-resistant layer 40, the gap(s) in the second inorganic layer 20 is arranged outside the first region A1, and an inorganic pattern unit 41 at the center of the second inorganic layer 20 covers the entire first region A1.

In this way, when the encapsulation structure 100 is applied to the display apparatus, the first region A1 of the encapsulation structure 100 corresponds to the display area of the display apparatus. In the plurality of inorganic pattern units 41 (for example, a plurality of inorganic pattern units 41 that are arranged concentrically) of the crack-resistant layer 40, the contour of the orthographic projection of an inorganic pattern unit located at the center of the crack-resistant layer 40 on the plane where the inorganic pattern unit is located surrounds the contour of the orthographic projection of the first region A1 on the plane where the inorganic pattern unit is located. In this way, water vapor and oxygen in the air may be prevented from entering the display area of the display apparatus through the gaps in the first inorganic layer 10 and the second inorganic layer 20, and the resistant effect of the encapsulation structure 100 for water vapor and oxygen may be improved.

Figure 17:
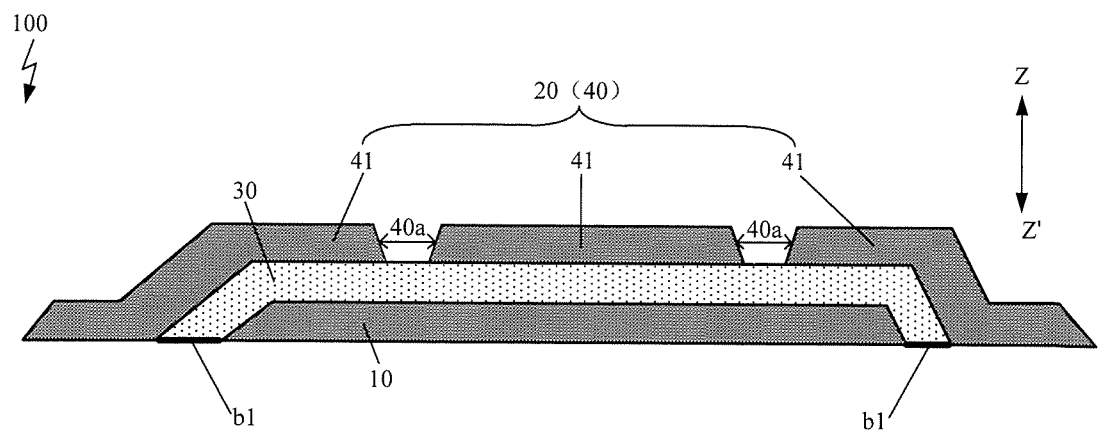
FIG. 17 is a schematic structural diagram of a cross-section of yet another encapsulation structure in a thickness direction thereof, provided by some embodiments of the present disclosure.
Figure 18:
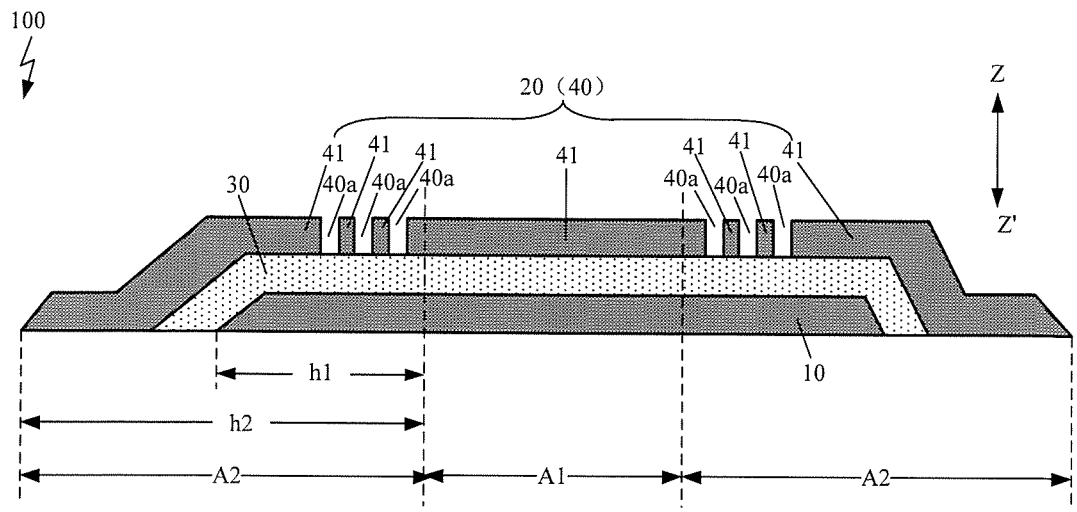
FIG. 18 is a schematic structural diagram of a cross-section of yet another encapsulation structure in a thickness direction thereof, provided by some embodiments of the present disclosure.
Figure 19:
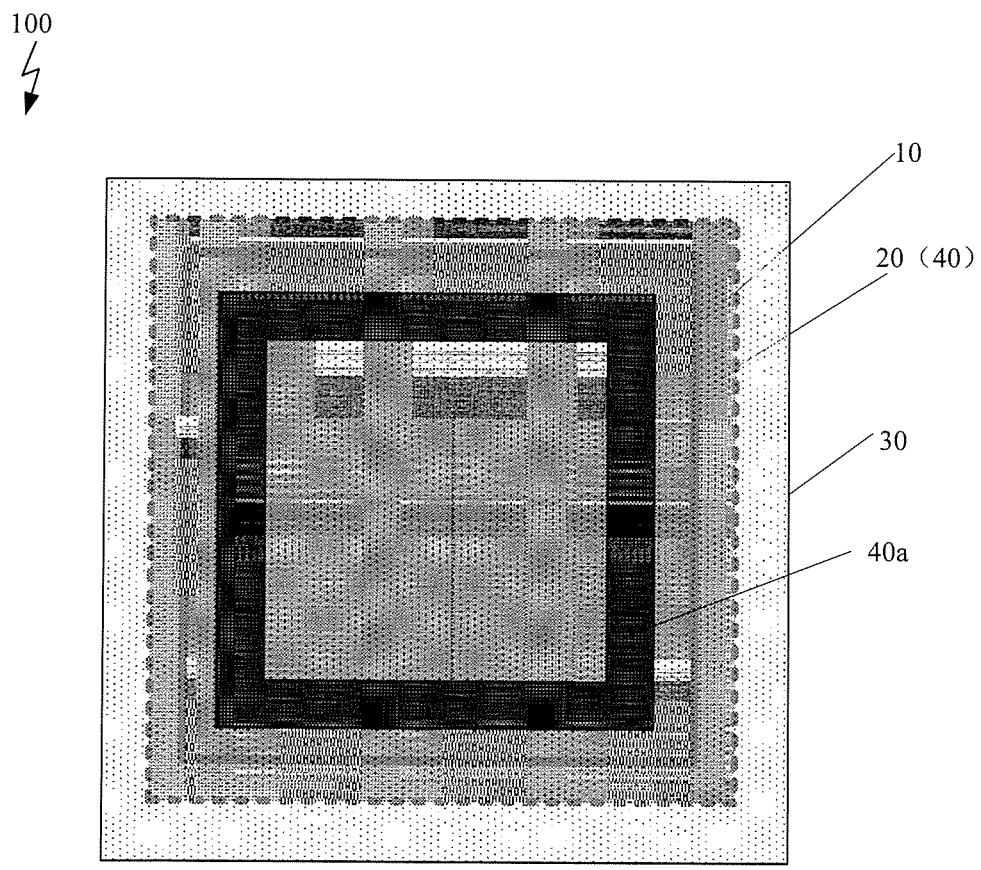
FIG. 19 is a schematic top view showing a structure of another encapsulation structure provided by some embodiments of the present disclosure.

In some embodiments of the present disclosure, as shown in FIGS. 17-19, the second inorganic layer 20 is a crack-resistant layer 40. A surface of the first organic layer 30 adjacent to the first inorganic layer 10 covers a surface of the first inorganic layer 10 adjacent to the first organic layer 30 and side faces of the first inorganic layer 10 connected to the surface of the first inorganic layer 10 adjacent to the first organic layer 30.

Here, in the direction from the first inorganic layer 10 to the first organic layer 30, the surface of the first organic layer 30 adjacent to the first inorganic layer 10 may also be referred to as a lower surface of the first organic layer 30, and the surface of the first inorganic layer 10 adjacent to the first organic layer 30 may also be referred to as an upper surface of the first inorganic layer 10.

In some embodiments of the present disclosure, as shown in FIGS. 17-19, the second inorganic layer 20 is a crack-resistant layer 40, and a surface of the second inorganic layer 20 adjacent to the first organic layer 30 at least covers side faces of the first organic layer 30.

Here, in the direction from the first inorganic layer 10 to the first organic layer 30, the surface of the second inorganic layer 20 adjacent to the first organic layer 30 may also be referred to as a lower surface of the second inorganic layer 20.

That is, after the first inorganic layer 10 is formed, the first organic layer 30 formed on the first inorganic layer 10 completely covers the first inorganic layer 10, and the second inorganic layer 20 formed thereafter covers the first organic layer 30 below.

Since the second inorganic layer 20 is a crack-resistant layer, that is, the second inorganic layer 20 has gap(s), the gap(s) in the second inorganic layer 20 do not cover the first organic layer 30, and the other portions of the second inorganic layer 20 cover the first organic layer 30.

As will be seen from FIGS. 17-19, since a surface of the first organic layer 30 adjacent to the first inorganic layer 10 covers the surface of the first inorganic layer 10 adjacent to the first organic layer 30 and the side faces connected to the surface of the first inorganic layer 10 adjacent to the first organic layer 30, the subsequently formed second inorganic layer 20 is not in contact with the first inorganic layer 10 below.

In this way, after the encapsulation structure 100 is applied to the display apparatus, if a crack is generated in the second inorganic layer 20, the crack will not extend to the first inorganic layer 10 below. Since the first inorganic layer 10 is located below the second inorganic layer 20, the external force received by the first inorganic layer 10 is extremely small when the display apparatus is bent, and the possibility of occurrence of the crack is small. Therefore, in a case where the first inorganic layer 10 is not a crack-resistant layer, that is, the first inorganic layer 10 does not have gap(s), the first inorganic layer 10 may have a better encapsulation effect.

In some embodiments of the present disclosure, as shown in FIGS. 17-19, in the thickness direction Z-Z' of the encapsulation structure 100, in the second inorganic layer 20, an orthographic projection of a gap between two adjacent inorganic pattern units 41 on a plane where the first inorganic layer 10 is located is within the range of the first inorganic layer 10.

That is, the first inorganic layer 10 is directly under the gap between two adjacent inorganic pattern units 41 in the second inorganic layer 20. Water vapor and oxygen are blocked by the first inorganic layer 10, and fail to directly pass through the encapsulation structure 100 through the gap between two adjacent inorganic pattern units 41 in the second inorganic layer 20, thereby improving the encapsulation effect.

It will be understood by those skilled in the art that in some embodiments of the present disclosure, since the side faces of the first inorganic layer 10 is covered by the first organic layer 30, and the first inorganic layer 10 is not in contact with the second inorganic layer 20, in order to avoid water vapor and oxygen passing through the encapsulation structure 100 into the first region of the encapsulation structure 100 through a spacer region b1 (shown in bold lines in FIG. 17) between the first inorganic layer 10 and the second inorganic layer 20, the spacer region b1 between the first inorganic layer 10 and the second inorganic layer 20 should be arranged to have a certain distance from the first region during use.

For example, as shown in FIG. 18, h1 represents a distance from an edge of an orthographic projection of the first inorganic layer 10 on the plane where the first inorganic layer 10 is located to an edge of an orthographic projection of the first region on the plane where the first inorganic layer 10 is located, and h1 is in a range of 100 μm to 200 μm. For example, h1 may be any one of 120 μm, 140 μm, 160 μm, and 180 μm.

Here, since a shape of the first region is generally a rectangle, an orthographic projection of the first region on the plane where the first inorganic layer 10 is located is also a rectangle, and the orthographic projection has four edges. Here, h1 refers to a distance between two edges that are proximate to each other, in which one edge is an edge of a plurality of edges of the orthographic projection of the first inorganic layer 10 on the plane and the other edge is an edge of a plurality of edges of the orthographic projection of the first region on the plane.

h2 represents a distance from an edge of an orthographic projection of the second inorganic layer 20 on a plane where the second inorganic layer 20 is located to an edge of the orthographic projection of the first region on the plane where the second inorganic layer 20 is located, and h2 is in a range of 400 μm to 600 μm. For example, h2 may be any one of 450 μm, 500 μm, and 550 μm.

Similarly, since a shape of the first region is generally a rectangle, an orthographic projection of the first region on the plane where the second inorganic layer 20 is located is also a rectangle, and the orthographic projection has four edges. Here, h2 refers to a distance between two edges that are proximate to each other, in which one edge is an edge of a plurality of edges of the orthographic projection of the second inorganic layer 20 on the plane and the other edge is an edge of a plurality of edges of the orthographic projection of the first region on the plane.

In some embodiments of the present disclosure, the encapsulation structure 100 may further include a protective layer disposed at the outermost side for avoiding a surface of the inorganic layer being scratched during the process of applying the encapsulation structure 100 to a display apparatus.

Figure 20:
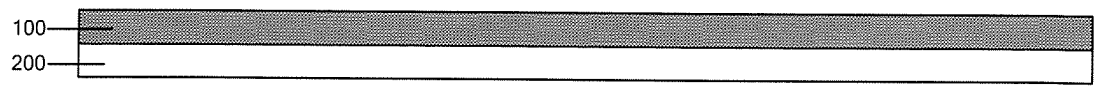
FIG. 20 is a schematic structural diagram of a display apparatus in a thickness direction thereof, provided by some embodiments of the present disclosure.

Some embodiments of the present disclosure provide a display apparatus. As shown in FIG. 20, the display apparatus includes a substrate 200 including at least one OLED device and the above encapsulation structure 100 for encapsulating the at least one OLED device.

Here, the substrate 200 includes a base, and at least one OLED device disposed on a surface of the base.

It will be understood that, for convenience of description, in FIG. 20, "a substrate 200 including at least one OLED device" is only represented by a single layer, and the specific structure of the substrate 200 is not actually illustrated; and similarly, the encapsulation structure 100 is only represented by a single layer, and the specific structure of the encapsulation structure 100 refers to the foregoing description, which will not be described here again.

The display apparatus may specifically be an OLED display apparatus, and may be any product or component having a display function such as a display panel, an apparatus including a display panel, a display, a television, a mobile phone, a tablet computer, or the like.

A bonding manner between the encapsulation structure 100 and the substrate 200 including the OLED device(s) is not limited. For example, after the encapsulation structure 100 is formed, the encapsulation structure 100 and the substrate 200 including the OLED device(s) may be bonded by optical adhesive to achieve the encapsulation of the OLED device(s) in the substrate 200. Or the encapsulation structure 100 may be directly formed on the substrate 200 including the OLED device(s). That is, the first inorganic layer 10 in the encapsulation structure 100 is directly formed (for example, directly deposited) on the substrate 200 including the OLED device(s) to achieve the encapsulation of the OLED device(s).

For example, a Low Temperature Poly-silicon (LTPS) backplane circuit structure is further formed on the substrate 200, for driving the OLED device(s) to emit light.

The beneficial effects of the display apparatus provided by some embodiments of the present disclosure are the same as the beneficial effects of the above encapsulation structure, which will not be described here again.

Figure 21:
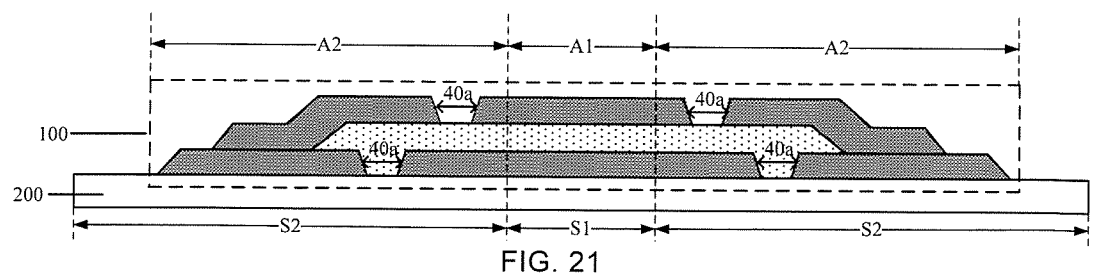
FIG. 21 is a schematic structural diagram of another display apparatus in a thickness direction thereof, provided by some embodiments of the present disclosure.
Figure 22:
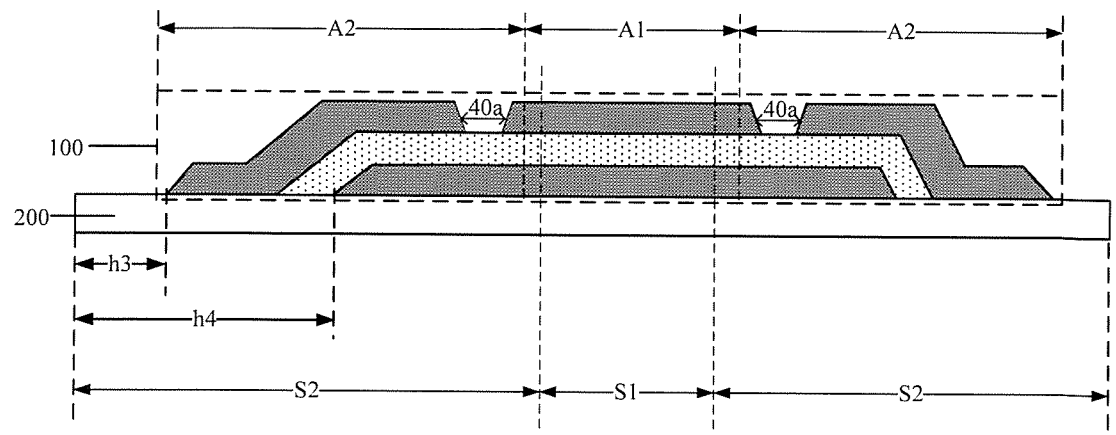
FIG. 22 is a schematic structural diagram of yet another display apparatus in a thickness direction thereof, provided by some embodiments of the present disclosure.

For example, as shown in FIGS. 21 and 22, the substrate includes a display area S1 and a non-display area S2 located at a periphery of the display area S1. A contour of an orthographic projection of the first region A1 of the encapsulation structure 100 on a plane where the encapsulation structure 100 is located surrounds a contour of an orthographic projection of the display area S on the plane where the encapsulation structure 100 is located.

That is, gap(s) in the crack-resistant layer of the encapsulation structure 100 do not correspond to the display area. In other words, the gap(s) in the crack-resistant layer 40 correspond to a region outside the display area, which may further improve the encapsulation effect.

The above description "a contour of an orthographic projection of the first region A1 of the encapsulation structure 100 on a plane where the encapsulation structure 100 is located surrounds a contour of an orthographic projection of the display area S on the plane where the encapsulation structure 100 is located" may mean that: a shape of the orthographic projection of the first region on the plane where the encapsulation structure 100 is located is the same as a shape of the orthographic projection of the display area on the plane where the encapsulation structure 100 is located, that is, they coincide; or the orthographic projection of the first region on the plane where the encapsulation structure 100 is located covers the orthographic projection of the display area on the plane where the encapsulation structure 100 is located.

Of course, the shape of the orthographic projection of the first region on the plane where the encapsulation structure 100 is located and the shape of the orthographic projection of the display area on the plane where the encapsulation structure 100 is located are not necessarily concentric, as long as the contour of the orthographic projection of the display area on the plane where the encapsulation structure 100 is located is within the range of the orthographic projection of the first region on the plane where the encapsulation structure 100 is located.

As shown in FIG. 22, in an example where the contour of the orthographic projection of the first region on the plane where the encapsulation structure 100 is located surrounds the contour of the orthographic projection of the display area on the plane where the encapsulation structure 100 is located, h4 represents a distance from an edge of the orthographic projection of the first inorganic layer 10 in the encapsulation structure 100 on the plane where the first inorganic layer 10 is located to an edge of the substrate, and h4 is in a range of 800 µm to 1000 µm. For example, h4 may be any one of 850 µm, 900 µm, and 950 µm, h3 represents a distance from an edge of the orthographic projection of the second inorganic layer 20 in the encapsulation structure 100 on the plane where the second inorganic layer 20 is located to the edge of the substrate, and h3 is in a range of 400 µm to 600 µm. For example, h3 may be any one of 450 µm, 500 µm, and 550 µm.

In this way, a spacer region between the first inorganic layer 10 and the second inorganic layer 20 has a certain distance from the display area, so as to prevent water vapor and oxygen from entering the display area of the substrate through the spacer region. Thereby, the encapsulation effect may be further improved.

The above embodiments are merely some specific embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

What is claimed is:

1. An encapsulation structure, comprising a first inorganic layer, a first organic layer and a second inorganic layer, all of which are sequentially stacked in a thickness direction of the encapsulation structure, wherein
    at least one of the first inorganic layer or the second inorganic layer is a crack-resistant layer;
    the crack-resistant layer includes at least one through hole therein, and the at least one through hole passes through the crack-resistant layer in the thickness direction of the encapsulation structure;
    the crack-resistant layer further includes a plurality of inorganic pattern units sequentially arranged in a direction from an inside to an outside of the crack-resistant layer; a gap is provided between two adjacent inorganic pattern units, and the gap is a through hole;
    or,
    the crack-resistant layer further includes a plurality of inorganic pattern units arranged concentrically; a gap is provided between two adjacent inorganic pattern units, and the gap is a through hole;
    in any crack-resistant layer, an inorganic pattern unit located at a center of the crack-resistant layer is a rectangular block, and at least one remaining inorganic pattern unit is a rectangular loop block.

2. The encapsulation structure according to claim 1, wherein both the first inorganic layer and the second inorganic layer are crack-resistant layers; and
    at least one orthographic projection of at least one gap in the first inorganic layer on a plane where the encapsulation structure is located and at least one orthographic projection of at least one gap in the second inorganic layer on the plane where the encapsulation structure is located are staggered.

3. The encapsulation structure according to claim 1, further comprising at least one encapsulation group disposed on a side of the second inorganic layer away from the first inorganic layer, wherein
    each encapsulation group includes a second organic layer and a third inorganic layer that are sequentially stacked in a direction from the first inorganic layer to the second inorganic layer; and
    the third inorganic layer is the crack-resistant layer.

4. The encapsulation structure according to claim 1, wherein a width of the gap is in a range of 50 µm to 200 µm.

5. The encapsulation structure according to claim 1, wherein the second inorganic layer is the crack-resistant layer, and
    a surface of the first organic layer adjacent to the first inorganic layer covers a surface of the first inorganic layer adjacent to the first organic layer and side faces connected to the surface of the first inorganic layer adjacent to the first organic layer.

6. The encapsulation structure according to claim 5, wherein at least one orthographic projection of at least one gap in the crack-resistant layer on a plane where the first inorganic layer is located is within a range of the first inorganic layer.

7. The encapsulation structure according to claim 1, wherein the second inorganic layer is the crack-resistant layer, and
    a surface of the second inorganic layer adjacent to the first organic layer covers a surface of the first organic layer adjacent to the second inorganic layer and at least covers side faces of the first organic layer connected to the surface of the first organic layer adjacent to the second inorganic layer.

8. The encapsulation structure according to claim 7, wherein at least one orthographic projection of at least one gap in the crack-resistant layer on a plane where the first inorganic layer is located is within a range of the first inorganic layer.

9. A display apparatus, comprising:
    a substrate provided with at least one organic light-emitting diode (OLED) device, and
    an encapsulation structure for encapsulating at least one OLED device according to claim 1.

10. The display apparatus according to claim 9, wherein the substrate includes a display area and a non-display area located at a periphery of the display area;
    the encapsulation structure includes a first region, and a second region surrounding the first region;
    a contour of an orthographic projection of the first region on a plane where the encapsulation structure is located surrounds a contour of an orthographic projection of the display area on the plane where the encapsulation structure is located; and in the plurality of inorganic pattern units of any crack-resistant layer, a contour of an orthographic projection of an inorganic pattern unit located at a center of the crack-resistant layer on a plane where the inorganic pattern unit is located surrounds a contour of an orthographic projection of the first region on the plane where the inorganic pattern unit is located.

11. The display apparatus according to claim 9, wherein the second inorganic layer is the crack-resistant layer,
- a surface of the first organic layer adjacent to the first inorganic layer covers a surface of the first inorganic layer adjacent to the first organic layer and side faces connected to the surface of the first inorganic layer adjacent to the first organic layer, and
- a surface of the second inorganic layer adjacent to the first organic layer covers a surface of the first organic layer adjacent to the second inorganic layer and at least covers side faces of the first organic layer connected to the surface of the first organic layer adjacent to the second inorganic layer.

12. The display apparatus according to claim 11, wherein a distance from an edge of an orthographic projection of the first inorganic layer on a plane where the first inorganic layer is located to an edge of an orthographic projection of the first region on the plane where the first inorganic layer is located is in a range of 100 μm to 200 μm; or
- a distance from an edge of an orthographic projection of the second inorganic layer on a plane where the second inorganic layer is located to an edge of an orthographic projection of the first region on the plane where the second inorganic layer is located is in a range of 400 μm to 600 μm; or
- a distance from an edge of an orthographic projection of the first inorganic layer on a plane where the first inorganic layer is located to an edge of an orthographic projection of the first region on the plane where the first inorganic layer is located is in a range of 100 μm to 200 μm, and a distance from an edge of an orthographic projection of the second inorganic layer on a plane where the second inorganic layer is located to an edge of an orthographic projection of the first region on the plane where the second inorganic layer is located is in a range of 400 μm to 600 μm.

13. The encapsulation structure according to claim 1, wherein a thickness of the first organic layer is greater than a thickness of any of the first inorganic layer and the second inorganic layer.

* * * * *